United States Patent [19]
Shafer

[11] Patent Number: 4,711,535
[45] Date of Patent: Dec. 8, 1987

[54] RING FIELD PROJECTION SYSTEM

[75] Inventor: David R. Shafer, Fairfield, Conn.

[73] Assignee: The Perkin-Elmer Corporation, Norwalk, Conn.

[21] Appl. No.: 732,764

[22] Filed: May 10, 1985

[51] Int. Cl.[4] ............................................. G02B 17/00
[52] U.S. Cl. .................................... 350/442; 350/505; 350/444
[58] Field of Search ................. 350/442, 444, 505, 443

[56] References Cited

U.S. PATENT DOCUMENTS

| | | | |
|---|---|---|---|
| 3,748,015 | 7/1973 | Offner | 350/55 |
| 3,821,763 | 6/1974 | Scott | 354/94 |
| 3,951,546 | 8/1976 | Markle | 355/51 |
| 4,011,011 | 3/1977 | Hemstreet et al. | 355/18 |
| 4,288,148 | 9/1981 | Offner et al. | 350/453 |
| 4,293,186 | 10/1981 | Offner | 350/444 |
| 4,469,414 | 9/1984 | Shafer | 350/444 |

FOREIGN PATENT DOCUMENTS 126911 3/1959 U.S.S.R. .

OTHER PUBLICATIONS

"New Catadioptric Meniscus System"; D. D. Maksutov; Journal of the Optical Society of America, vol. 34, No. 5; May 1944.

"Unit Magnification Optical System Without Seidel Aberrations"; J. Dyson; Journal of the Optical Society of America, vol. 49, No. 7; Jul. 1959.

Primary Examiner—John K. Corbin
Assistant Examiner—P. M. Dzierzynski
Attorney, Agent, or Firm—Thomas P. Murphy; Edwin T. Grimes; Paul A. Fattibene

[57] ABSTRACT

The present invention is directed to Optical Lithographic Systems which are particularly adapted, among many other possible uses, for use in effecting exposure of photoresist-coated semiconductor wafers, having a ring field projection system which includes at least one concave and one convex mirror arranged around an optical axis in face-to-face relationship with their centers of curvature being nearly concentric and falling on the axis, the convex mirror being smaller than and having a smaller radius of curvature than the concave mirror, an object location and a conjugate real image location, said convex mirror being positioned to reflect to the concave mirror light from the object location initially reflected from the concave mirror whereby light from the object location will be reflected at least twice at said concave mirror and at least once at the convex mirror before being focused at the image location, elements for limiting the image field to an annular zone centered about the optical axis, a first thick, flat parallel plate mounted in the light path between the object and image locations adjacent the object location, a second thick, flat parallel plate nearly identical to the first plate mounted in the light path between the object and image locations adjacent the image location, a first pair of symmetrically disposed nearly concentric meniscus elements mounted in the light path between the object and image locations at a spaced distance from the plates, respectively, a second pair of symmetrically disposed meniscus elements mounted in the light path between the object and image locations adjacent the first pair of meniscus elements, and the plates and elements being constructed and arranged so that the meniscus elements reduce spherical aberration of the principal rays in the system and introduce chromatic aberrations which are substantially cancelled by the thick, flat parallel plates.

8 Claims, 5 Drawing Figures

RING FIELD PROJECTION SYSTEM

FIELD OF INVENTION

This invention relates to optical lithographic systems and, more particularly, to such systems which are particularly adapted, among many other possible uses, for use in effecting the exposure of photoresist-coated semiconductor wafers in the manufacture of integrated circuits. This application is closely related to U.S. patent application Ser. No. 732,593 filed May 10, 1985, now U.S. Pat. No. 4,650,315 entitled "Optical Lithographic System". Said application is assigned to the same assignee as the present application. The disclosure in said application is incorporated herein by reference.

BACKGROUND OF THE INVENTION

Pioneer patents in the filed of microlithography projection printing include the patents of R. M. Scott, U.S. Pat. No. 3,821,763, and A. Offner, U.S. Pat. No. 3,748,015. The Scott patent shows a restricted off-axis field optical system in which an annular slit is used to restrict the field to an annular zone centered on the optical axis, and the system is optically corrected to preferentially increase image quality in the annular zone. The Offner patent discloses a catoptric, off-axis annular field optical system for forming in accurate micro detail an image of an object at unit magnification with high resolution, including convex and concave mirrors in face-to-face relationships with their centers of curvature being nearly concentric. Another high performance optical system is disclosed in the A. Offner U.S. Pat. No. 4,293,186, which includes a system having refractive elements and having means for obtaining stigmatic imagery in the restricted off-axis field over an extended spectral range by balancing the chromatic variation in focus at the center of the restricted off-axis field due to the variation of field curvature with color by introducing axial color aberration of the opposite sense.

Meniscus elements can be used to reduce or remove the spherical aberration of principal rays parallel to the optical axis, see the publication entitled "Achievements in Optics" by A. Bouwers, Elsevier Publishing Company, Inc., 1946 (particularly pages 24, 25 and 39) and the article appearing in the *Journal of the Optical Society of America*, Vol. 34 No. 5, May 1944, pp. 270–284, entitled: "New Catadioptric Meniscus System" by D. D. Maksutov. Methods of correcting the axial longitudinal color aberration of said systems are also described in these references.

Other related patents and publications in this field include: Russian Pat. No. 126,911, issued Mar. 30, 1959; French Pat. No. 784,063 issued July 22, 1935; U.S. Pat. No. 3,244,073 issued Apr. 5, 1966; U.S. Pat. No. 3,821,763 issued June 28, 1974; U.S. Pat. No. 3,951,546 issued Apr. 20, 1976 and U.S. Pat. No. 4,011,011 issued Mar 8, 1977, which is a continuation of U.S. patent application Ser. No. 339,860, filed Mar. 9, 1973 (now abandoned); U.S. Pat. No. 4,288,148 issued Sept. 8, 1981; "Unit Magnification Optical System Without Seidel Aberrations", by J. Dyson, *Journal of the Optical Society of America*, Vol. 49, pp. 713, 1959; U.S. patent application Ser. No. 308,647 filed Oct. 5, 1981 entitled "Method and Apparatus for Optical System Adjustments", which shows means and method for correcting an image forming optical system for deviations from the theoretical design performance resulting from manufacturing errors in its optical components and errors in their assembly and/or alignment.

A particularly desirable restricted off-axis field optical system having a broad spectral range is disclosed in patent application Ser. No. 383,683 filed June 1, 1982, which describes an optical system comprising first and second substantially concentric optical subsystems, which are constructed and arranged with respect to each other so that variation in performance of one subsystem with wavelength substantially balances that of the other. That is, the subsystems are constructed and arranged with respect to each other so that the sum of the refractive powers is nearly zero and the sum of the reflective powers is also nearly zero.

The term "nearly" and the term "nearly concentric" are intended to cover installations where there are two points or two centers which are made as close to being coincident as is physically possible to achieve, and it is also intended to cover the installations where the points or centers are very close together but purposely slightly spaced one from another.

SUMMARY OF THE INVENTION

In order to accomplish the desired results, the invention provides a new and improved ring field projection system which is characterized by at least one concave and one convex mirror arranged around an optical axis in face-to-face relationship with their centers of curvature being nearly concentric and falling on said axis. The convex mirror is smaller than and has a smaller radius of curvature than the concave mirror. Means are provided for defining an object location and a conjugate real image location. The convex mirror is positioned to reflect to said concave mirror light from the object location initially reflected from the concave mirror, whereby light from the object location will be reflected at least twice at said concave mirror and at least once at the convex mirror before being focused at the image location. Further, the system includes means for limiting the image field to an annular zone centered about the optical axis. A first thick, flat parallel plate is mounted in the light path between the object and image locations adjacent the object location, and a second thick, flat parallel plate nearly identical to the first plate is mounted in the light path between the object and image locations adjacent the image location. A first pair of symmetrically disposed nearly concentric meniscus elements is mounted in the light path between the object and the image locations at a spaced distance from the plates, respectively. A second pair of symmetrically disposed meniscus elements is mounted in the light path between the object and image locations adjacent the first pair of meniscus elements, respectively. The plates and the meniscus elements are constructed and arranged so that the meniscus elements reduce spherical aberration of the principal rays in the system and introduce chromatic aberrations which are substantially cancelled by the thick, flat parallel plates.

There has thus been outlined rather broadly the more important features of the invention in order that the detailed description thereof that follows may be better understood, and in order that the present contribution to the art may be better appreciated. There are, of course, additional features of the invention which will be described hereinafter and which will form the subject of the claims appended hereto. Those skilled in the art will appreciate that the conception upon which the disclosure is based may readily be utilized as a basis for the designing of other systems for carrying out the several purposes of the invention. It is important, therefore, that the claims be regarded as including such equivalent systems as do not depart from the spirit and scope of the invention.

Specific embodiments of the invention have been chosen for purposes of illustration and description, and are shown in accompanying drawings, forming a part of the specification.

DETAILED DESCRIPTIONS OF THE PRESENTLY PREFERRED EMBODIMENTS

Figure 1:
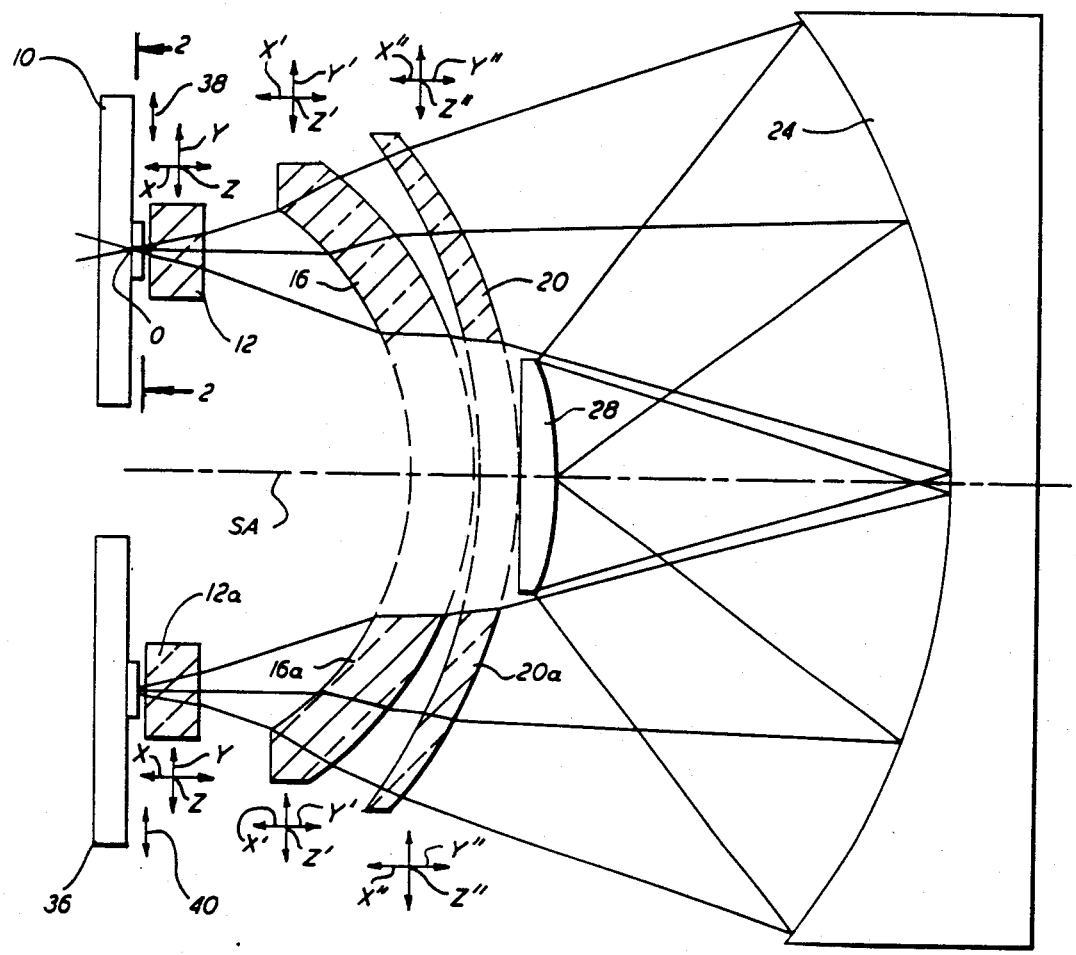
FIG. 1 is a schematic representation of a first embodiment of an optical system, constructed in accordance with the concepts of the present invention.

In the embodiment of the invention illustrated in FIG. 1, a ring field projection system comprises an object plane O where a mask 10 is mounted to receive a light image, and a conjugate real image location or plane I where a wafer is mounted. A thick, flat parallel plate or window 12 is mounted closely adjacent the mask 10. This plate could be in the form of a beam splitter, if desired, for alignment purposes. Spaced a distance from the thick plate 12 is a first pair of symmetrically disposed nearly concentric meniscus elements 16, 16a. Disposed directly adjacent the first meniscus elements 16, 16a is a second pair of symmetrically disposed meniscus elements, 20, 20a. The second pair of meniscus elements are substantially non-concentric but are strongly meniscus. Spaced from the pair of meniscus elements 20, 20a is a concave spherical mirror 24. A convex spherical mirror 28 is mounted directly adjacent the second meniscus elements 20, 20a. The two spherical mirrors are arranged to provided three reflections within the system. The mirrors are arranged to have their centers of curvature nearly concentrically disposed along the system axis SA. The light rays then return through the second meniscus element 20a, the first meniscus element 16a and the second identical thick, flat plate 12a to the image plane I where a wafer 36 is mounted. The first pair of meniscus elements 16, 16a may consist of a single meniscus element, and the second pair of meniscus elements 20, 20a may consist of a single meniscus element. It is noted that the meniscus elements 16, 16a, 20, 20a serve to reduce the spherical aberration of the principal rays in the system. However, they introduce chromatic aberrations, which are substantially cancelled by the two thick, flat parallel plates 12, 12a. The mask 10 and/or the wafer 36 may be mounted for scanning movement, as schematically indicated by arrows 38 and 40, respectively. This ring field projection system may be designed for use in a scanning mode or in a step and scan mode, as desired.

Figure 2:
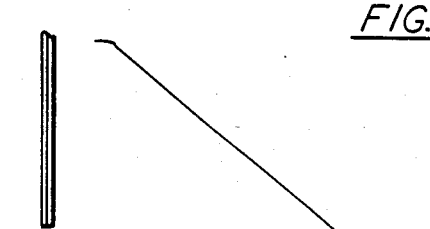
FIG. 2 is an enlarged view taken along the line indicated at 2—2 in FIG. 1.

FIG. 2 shows an example of one means for restricting the off-axis field. As illustrated, a mask 42 containing a curved slit 44 of radius H is placed with its center of curvature at the optical axis SA, and in the object plane at O so as to restrict the imagery to that portion of the object area which is exposed through the slit 44. That portion of the object area will be imaged stigmatically onto a similar curved area in the image plane I. This comes about because all portions of the object and image that are in the slit or in the image of the slit, are all at substantially the same distance H from the optical axis SA, at which the system is corrected. The mask 42 could be provided ahead of the object plane, in the object plane, in the image plane, or a mask could be provided in each plane, or the mask could be so positioned that the image thereof is in the image of the plane I.

As pointed out in U.S. patent application Ser. No. 308,647, filed Oct. 5, 1981, entitled "Method and Apparatus for Optical System Adjustments", it is important to provide a system for correcting an image forming optical system for deviations from theoretical design performance resulting from manufacturing errors in its optical components and errors in their assembly and/or alignment. In order to implement this in the present embodiment, a relatively large number of elements are employed which thereby provide many possible degrees of correction. Thus, in the present embodiment, elements 12, 12a and 16, 16a and 20, 20a are each suitably mounted such as, for example, by bearing means or flexible pivots or the like to permit precisely-controlled, minute displacements in translation and/or rotation about at least one of three orthogonal axes indicated by vectors X, Y and Z, and X', Y' and Z' and X", Y" and Z" in FIG. 1 adjacent the respective elements.

Table I is an example, indicating the construction data of the ring field projection system of FIG. 1:

TABLE I

| Nominal Radius of Annulus = 6.5 mm at f/1.65 | | | |
|---|---|---|---|
| Surface Number | Radius (mm.) | Distance To Next Surface (mm.) | Material | Note |
| 1 | flat object | 4.515 | Air | |
| 2 | ∞ | 15.240 | Fused Silica | |
| 3 | ∞ | 59.576 | Air | |
| 4 | −87.908 | 15.042 | Fused Silica | |
| 5 | −107.332 | 2.557 | Air | |
| 6 | −173.132 | 11.769 | Fused Silica | |
| 7 | −151.024 | 118.875 | Air | |
| 8 | −222.803 | −111.189 | −Air | |
| 9 | −107.843 | 111.189 | Air | |
| 10 | −222.803 | −118.876 | −Air | |
| 11 | −151.024 | −11.759 | −Fused Silica | |
| 12 | −173.132 | −2.557 | −Air | |
| 13 | −107.332 | −15.042 | −Fused Silica | |
| 14 | −87.908 | −59.576 | −Air | |
| 15 | ∞ | −15.240 | −Fused Silica | |
| 16 | ∞ | −4.520 | −Air | |
| 17 | Flat Image | | −Air | |

Figure 3:
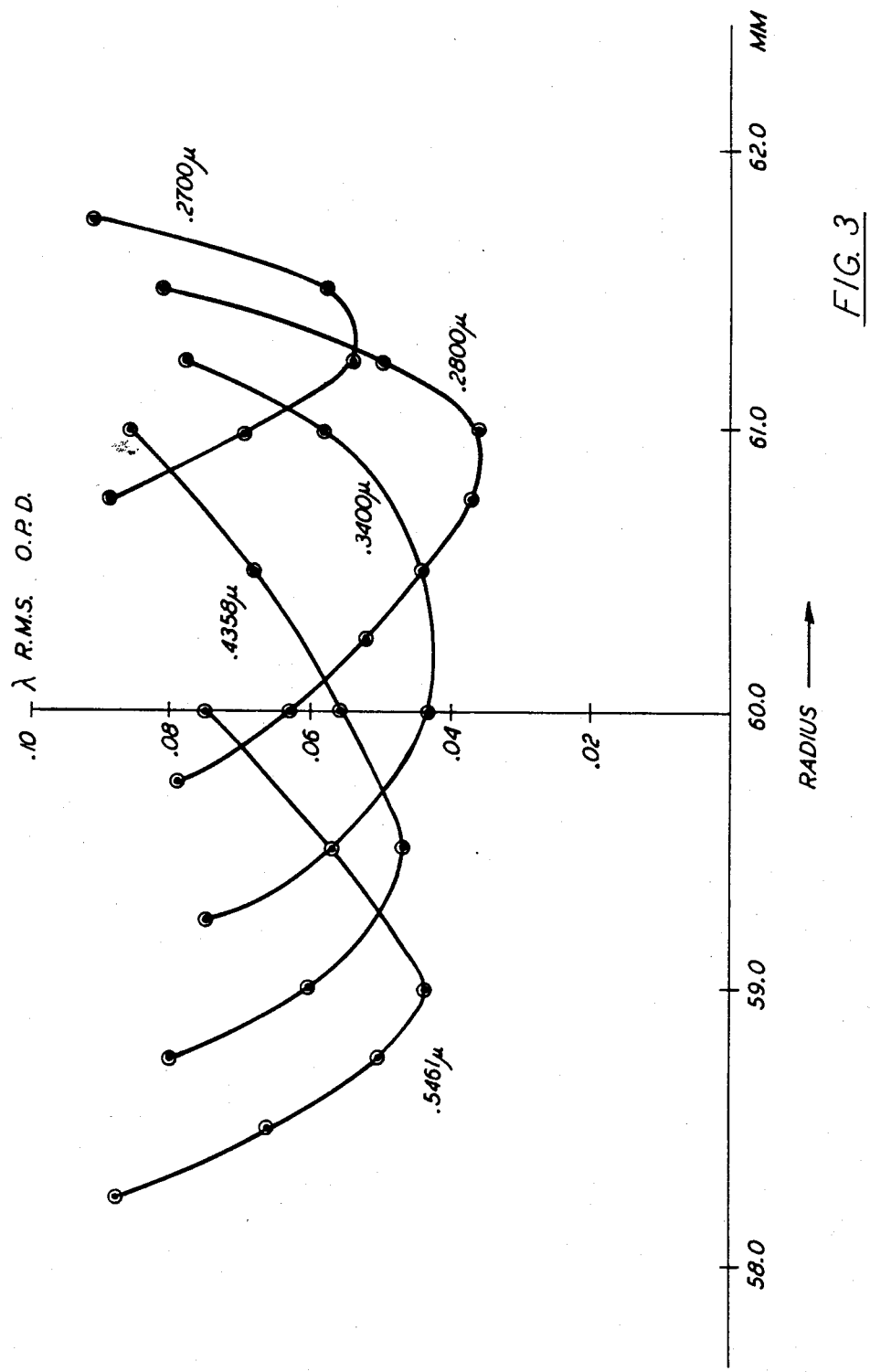
FIG. 3 is a graph showing image quality as a function of the radial distance from the optical axis for light at various wavelengths, using the ring field projection system of FIG. 1.

It will be appreciated that the ring field projection system of FIG. 1 is highly corrected by means of balancing one aberration against another over the region of the slit. FIG. 3 shows a series of curves plotting the optical radial zone of the slit for imaging by the projection system of FIG. 1 at various wavelengths with design data similar to that shown in Table I. The abscissa is the radial distance from the optical axis in millimeters, and the ordinate r.m.s.O.P.D. is a measure of image quality. As seen in FIG. 3, the optical correction for the design shown in FIG. 1 is in a radial zone between 59 and 60.50 millimeters from the optical axis for light with a 0.4358 micron wavelength. This zone changes to a zone from 59.70 to 61.5 millimeters for light with a 0.2900μ micron wavelength.

Figure 4:
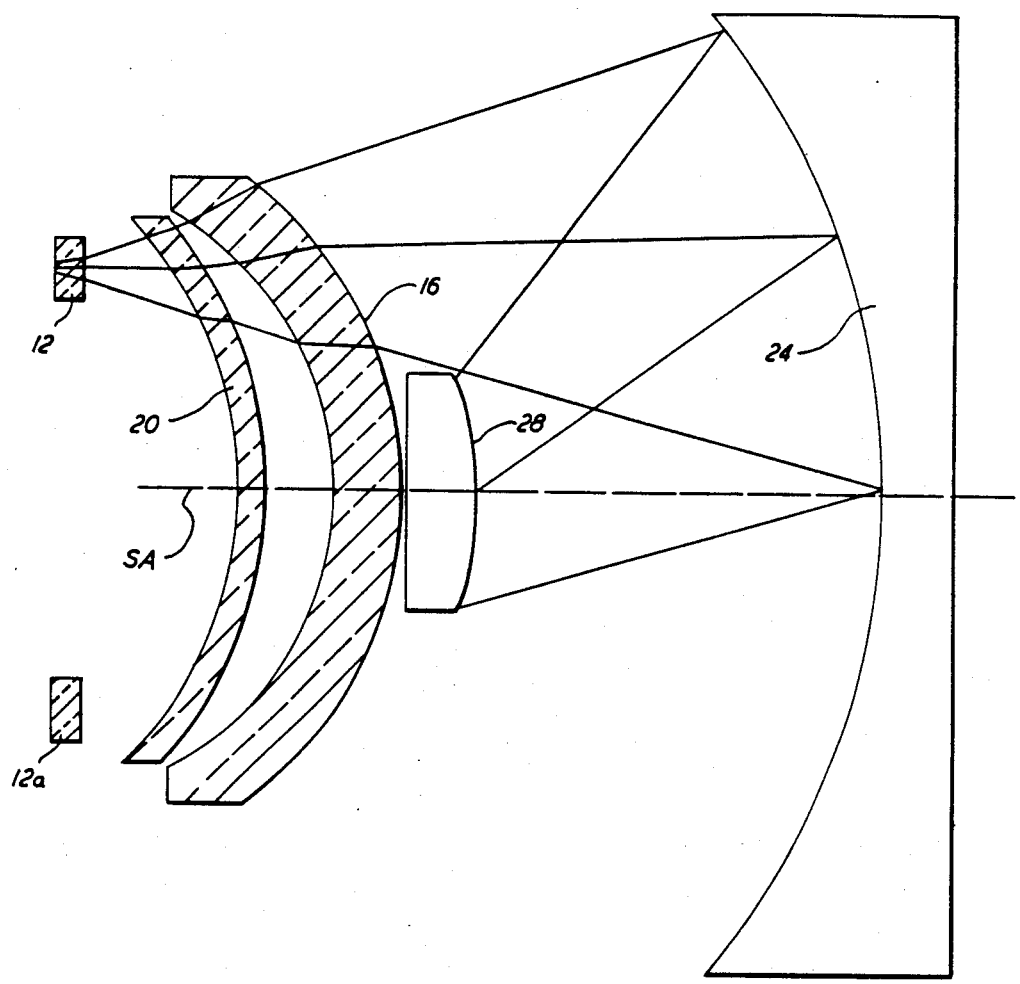
FIG. 4 illustrates a second embodiment of the optical system of the present invention.

FIG. 4 illustrates an optical system which functions in a manner similar to that of FIG. 1. However, in FIG. 4 the positions of meniscus elements 16 and 20 are reversed relative to their positions as shown in FIG. 1. The meniscus elements 16 and 20 may be divided into pairs as in FIG. 1.

Figure 5:
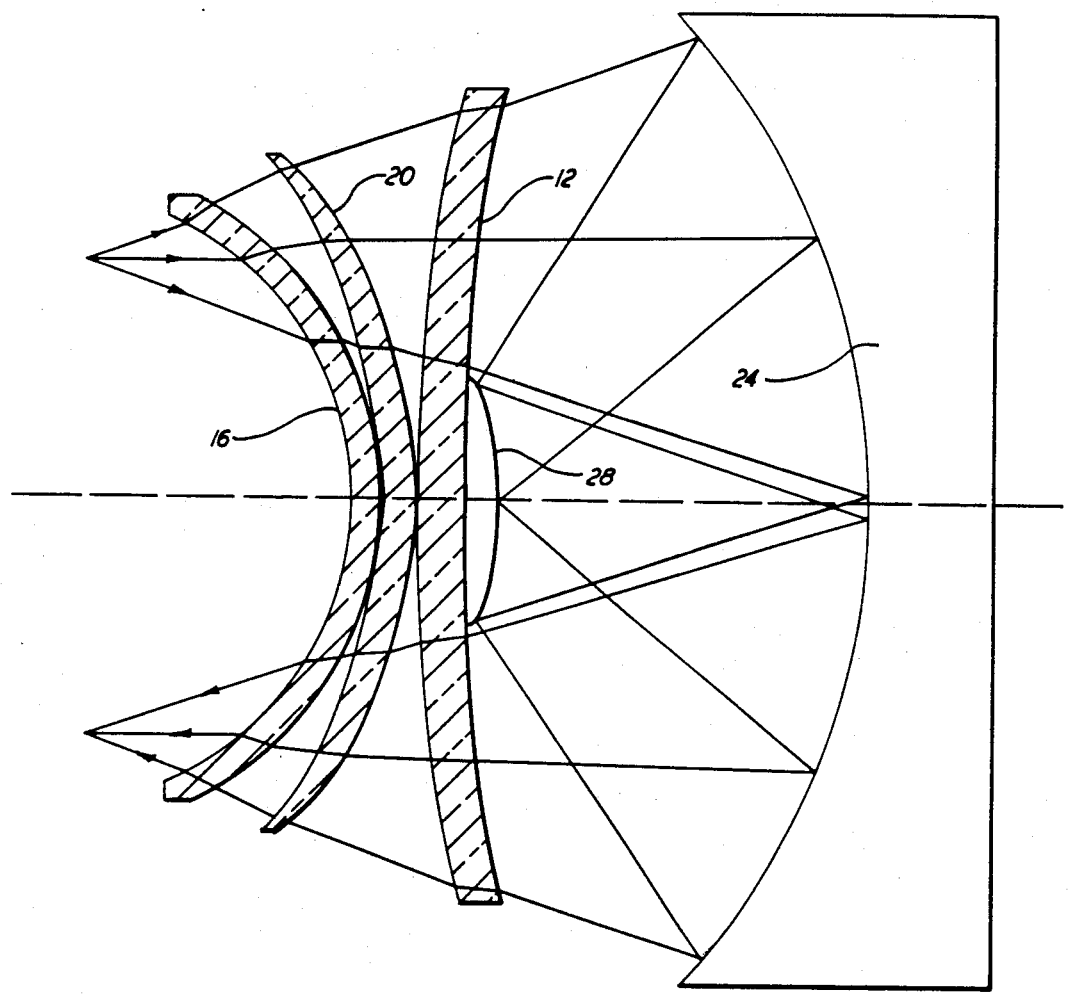
FIG. 5 illustrates a third embodiment of the optical system of the present invention.

FIG. 5 shows another variation of the optical system of FIG. 1. In this embodiment the thick lens 12 is a single element disposed between meniscus element 20 and convex mirror 28. Here again the meniscus elements 16 and 20 could be in pairs as in FIG. 1 and the lens 12 could also be a pair as in FIG. 1. In FIG. 5 the lens 15 may be flat or slightly curved as shown in the Figure.

The lenses and mirrors described in the present specification may be fabricated from any suitable material such as, for example, fused silica. A feature of the invention resides in the fact that all of the elements may be fabricated from the same optical material and at the same time correction is maintained for a broad spectral range.

Although specific embodiments have been illustrated and described, it will be obvious to those skilled in the art that various modifications may be made without departing from the spirit and scope of the invention, which is to be limited solely by the appended claims.

What is claimed is:

1. A ring field projection system comprising, in combination:
    at least one concave and one convex mirror arranged around an optical axis in face-to-face relationship with their centers of curvature being nearly concentric and falling on said axis, the convex mirror being smaller than and having a smaller radius of curvature than the concave mirror;
    means defining an object location and a conjugate real image location, said convex mirror being positioned to reflect to said concave mirror light from said object location initially reflected from said concave mirror whereby light from said object location will be reflected at least twice at said concave mirror and at least once at said convex mirror before being focused at the image location;
    means for limiting the image field to an annular zone centered about the optical axis;
    a first thick, flat parallel plate mounted in the light path between the object and image locations adjacent said object location;
    a second thick, flat parallel plate nearly identical to said first plate mounted in the light path between the object and image locations adjacent said image location;
    strong meniscus element means, mounted in the light path between said object and image locations at a spaced distance from said plates, for reducing spherical aberrrations of the principal rays and introducing chromatic aberrations, the two radius of curvatures of said strong meniscus element means differing by at least 20 percent; and
    weak meniscus element means, mounted in the light path between said object and image locations adjacent said strong meniscus element means, for reducing spherical aberrations of the principal rays and introducing chromatic aberrations, the two radius of curvatures of said weak meniscus element means differing by at least 10 percent;
    said plates and elements being constructed and arranged so that both said meniscus element means reduce spherical aberrations of the principal rays in the system and introduce chromatic aberrations which are substantially cancelled by said thick, flat parallel plates.

2. A ring field projection system according to claim 2 wherein said plates and said strong and weak meniscus element means are all positioned between said mirrors and said object and image locations.

3. A ring field projection system according to claim 1 wherein said strong and weak meniscus element means and said convex mirror are all closely adjacent each other and spaced from said plates and said concave mirror.

4. A ring field projection system according to claim 1 wherein said strong meniscus element means consist of a single meniscus element.

5. A ring field projection system according to claim 1 wherein said weak meniscus elements means consist of a single meniscus element.

6. A ring field projection system according to claim 1 wherein at least one of said strong or weak meniscus element means is mounted for translational displacement along and/or rotational displacement about one or more of three orthogonal axes, said displacements being such in character, direction and extent as to correct the system for deviation from theoretical design performance resulting from manufacturing errors in said components and errors in their assembly and alignment.

7. A ring field projection system as in claim 1 wherein:
    said weak meniscus element means is mounted in the light path between said object and image locations at a spaced distance from said plates; and
    said strong meniscus element means is mounted in the light path between said object and image locations between said weak meniscus element means and said convex mirror.

8. A ring field projection system comprising, in combination:
    at least one concave and one convex mirror arranged around an optical axis in face-to-face relationship with their centers of curvature being nearly concentric and falling on said axis, the convex mirror being smaller than and having a smaller radius of curvature than the concave mirror;
    means defining an object location and a conjugate real image location, said convex mirror being positioned to reflect to said concave mirror light from said object location initially reflected from said concave mirror whereby light from said object location will be reflected at least twice at said concave mirror and at least once at said convex mirror before being focused at the image location;
    means for limiting the image field to an annular zone centered about the optical axis;
    a first thick, flat parallel plate mounted in the light path between the object and image locations adjacent said object location;
    a second thick, flat parallel plate nearly identical to said first plate mounted in the light path between the object and image locations adjacent said image location;
    a first pair of symmetrically disposed nearly concentric meniscus elements mounted in the light path between said object and image locations at a spaced distance from said plates, respectively;

a second pair of symmetrically disposed meniscus elements mounted in the light path between said object and image locations adjacent said first pair of meniscus elements, respectively;

said plates and elements being constructed and arranged so that said meniscus elements reduce spherical aberrations of the principal rays in the system and introduce chromatic aberrations which are substantially cancelled by said thick, flat parallel plates; and wherein said system is characterized by the following construction data:

| Nominal Radius of Annulus = 61.5 mm. | | | | |
|---|---|---|---|---|
| Surface Number | Radius (mm.) | Distance To Next Surface (mm.) | Material | Note |
| 1 | flat object | 4.515 | Air | |
| 2 | ∞ | 15.240 | Fused Silica | |
| 3 | ∞ | 59.576 | Air | |
| 4 | −87.908 | 15.042 | Fused Silica | |
| 5 | −107.332 | 2.557 | Air | |
| 6 | −173.132 | 11.769 | Fused Silica | |
| 7 | 151.024 | 118.875 | Air | |
| 8 | −222.803 | −111.189 | −Air | |
| 9 | −107.843 | 111.189 | Air | |
| 10 | −222.803 | −118.876 | −Air | |
| 11 | −151.024 | 11.759 | −Fused Silica | |
| 12 | −173.132 | −2.557 | −Air | |
| 13 | −107.332 | −15.042 | −Fused Silica | |
| 14 | −87.908 | −59.576 | −Air | |
| 15 | ∞ | −15.240 | −Fused Silica | |
| 16 | ∞ | −4.520 | −Air | |
| 17 | Flat Image | | −Air | |

* * * * *